US012701780B2

(12) United States Patent
Yemenicioglu et al.

(10) Patent No.: US 12,701,780 B2
(45) Date of Patent: Aug. 4, 2026

(54) WALL THAT INCLUDES A GAS BETWEEN METAL GATES OF A SEMICONDUCTOR DEVICE

(71) Applicant: Intel Corporation, Santa Clara, CA (US)

(72) Inventors: Sukru Yemenicioglu, Portland, OR (US); Leonard P. Guler, Hillsboro, OR (US); Hongqian Sun, Sammamish, WA (US); Shengsi Liu, Portland, OR (US); Tahir Ghani, Portland, OR (US); Baofu Zhu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 17/958,285

(22) Filed: Sep. 30, 2022

(65) Prior Publication Data

US 2024/0113108 A1     Apr. 4, 2024

(51) Int. Cl.
| | |
|---|---|
| *H01L 27/088* | (2006.01) |
| *H01L 21/764* | (2006.01) |
| *H01L 21/8234* | (2006.01) |
| *H01L 29/06* | (2006.01) |
| *H01L 29/423* | (2006.01) |
| *H01L 29/786* | (2006.01) |
| *H10D 30/67* | (2025.01) |
| *H10D 62/10* | (2025.01) |
| *H10D 84/01* | (2025.01) |
| *H10D 84/03* | (2025.01) |
| *H10D 84/83* | (2025.01) |
| *H10W 10/00* | (2026.01) |
| *H10W 10/20* | (2026.01) |

(52) U.S. Cl.
CPC ......... *H10D 84/83* (2025.01); *H10D 30/6735* (2025.01); *H10D 30/6757* (2025.01); *H10D 62/121* (2025.01); *H10D 84/0151* (2025.01); *H10D 84/038* (2025.01); *H10W 10/021* (2026.01); *H10W 10/20* (2026.01)

(58) Field of Classification Search
CPC .............. H10D 84/83; H10D 30/6735; H10D 30/6757; H10D 62/121; H10D 84/0151; H10D 84/038; H10D 30/014; H10D 30/43; H01L 21/764; B82Y 10/00
USPC ........................................ 257/401
See application file for complete search history.

(56) References Cited

U.S. PATENT DOCUMENTS

| | | | |
|---|---|---|---|
| 2020/0411661 A1* | 12/2020 | Guler ................... | H10D 62/119 |
| 2022/0262915 A1* | 8/2022 | Su ........................ | H10D 30/031 |

* cited by examiner

*Primary Examiner* — Tong-Ho Kim
(74) *Attorney, Agent, or Firm* — Schwabe, Williamson & Wyatt P.C.

(57) ABSTRACT

Embodiments described herein may be related to apparatuses, processes, systems, and/or techniques for forming a wall within a metal gate cut in a transistor layer of a semiconductor device, where the wall includes a volume of a gas such as air, nitrogen, or another inert gas. Other embodiments may be described and/or claimed.

25 Claims, 13 Drawing Sheets

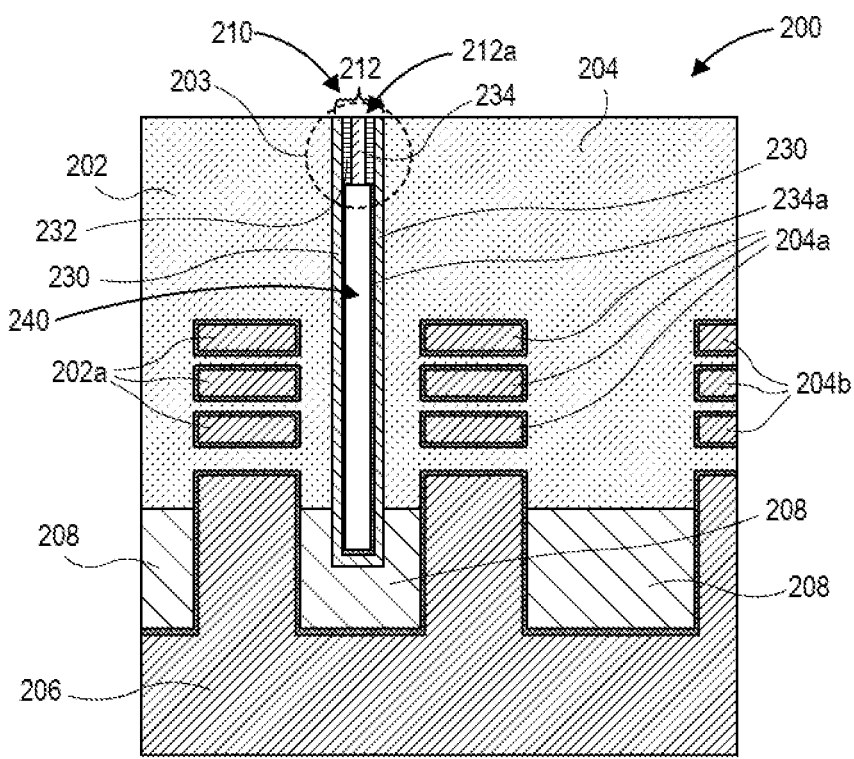
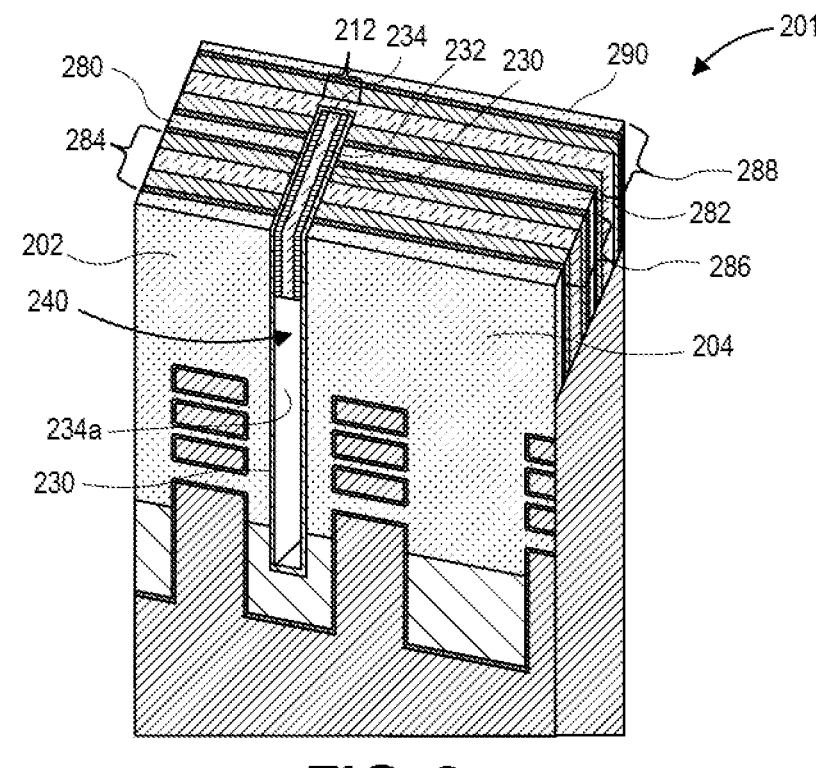
FIG. 2

600

694

696

692

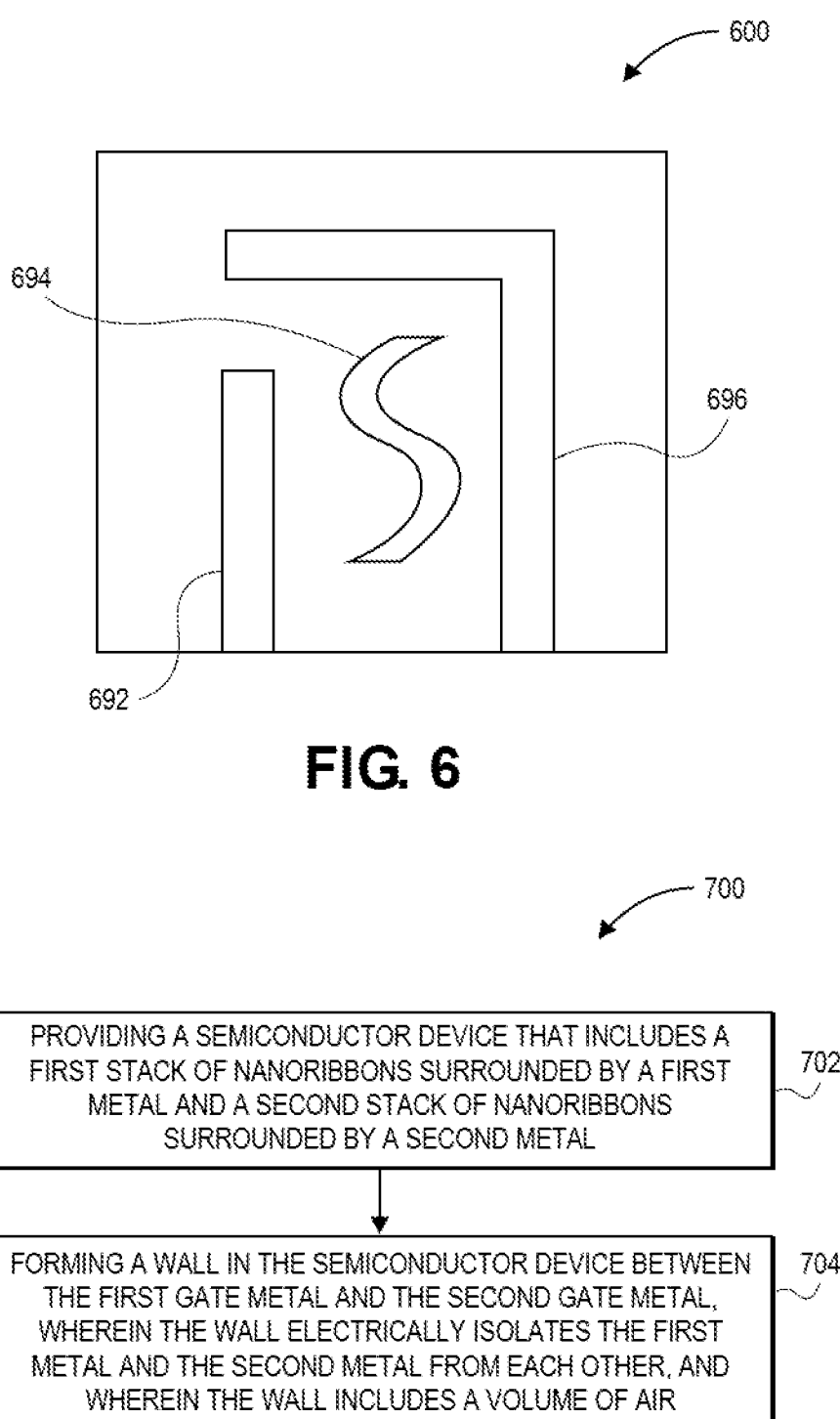

| PROVIDING A SEMICONDUCTOR DEVICE THAT INCLUDES A FIRST STACK OF NANORIBBONS SURROUNDED BY A FIRST METAL AND A SECOND STACK OF NANORIBBONS SURROUNDED BY A SECOND METAL | 702 |

| FORMING A WALL IN THE SEMICONDUCTOR DEVICE BETWEEN THE FIRST GATE METAL AND THE SECOND GATE METAL, WHEREIN THE WALL ELECTRICALLY ISOLATES THE FIRST METAL AND THE SECOND METAL FROM EACH OTHER, AND WHEREIN THE WALL INCLUDES A VOLUME OF AIR | 704 |

FIG. 7

WALL THAT INCLUDES A GAS BETWEEN METAL GATES OF A SEMICONDUCTOR DEVICE

FIELD

Embodiments of the present disclosure generally relate to the field of semiconductor manufacturing, and in particular to metal gates within transistor structures.

BACKGROUND

Continued growth in virtual machines, cloud computing, and portable devices will continue to increase the demand for high density transistors within chips and packages. In addition, there will be an increased need for high quality transistor components with increased performance.

BRIEF DESCRIPTION OF THE DRAWINGS

FIG. 6 illustrates a top-down cross-section view of a semiconductor device with different designs of a wall that include a volume of air within the wall, in accordance with various embodiments.

FIG. 7 illustrates an example process for manufacturing a semiconductor device that includes a wall that includes a volume of air, in accordance with various embodiments.

DETAILED DESCRIPTION

Figure 1:
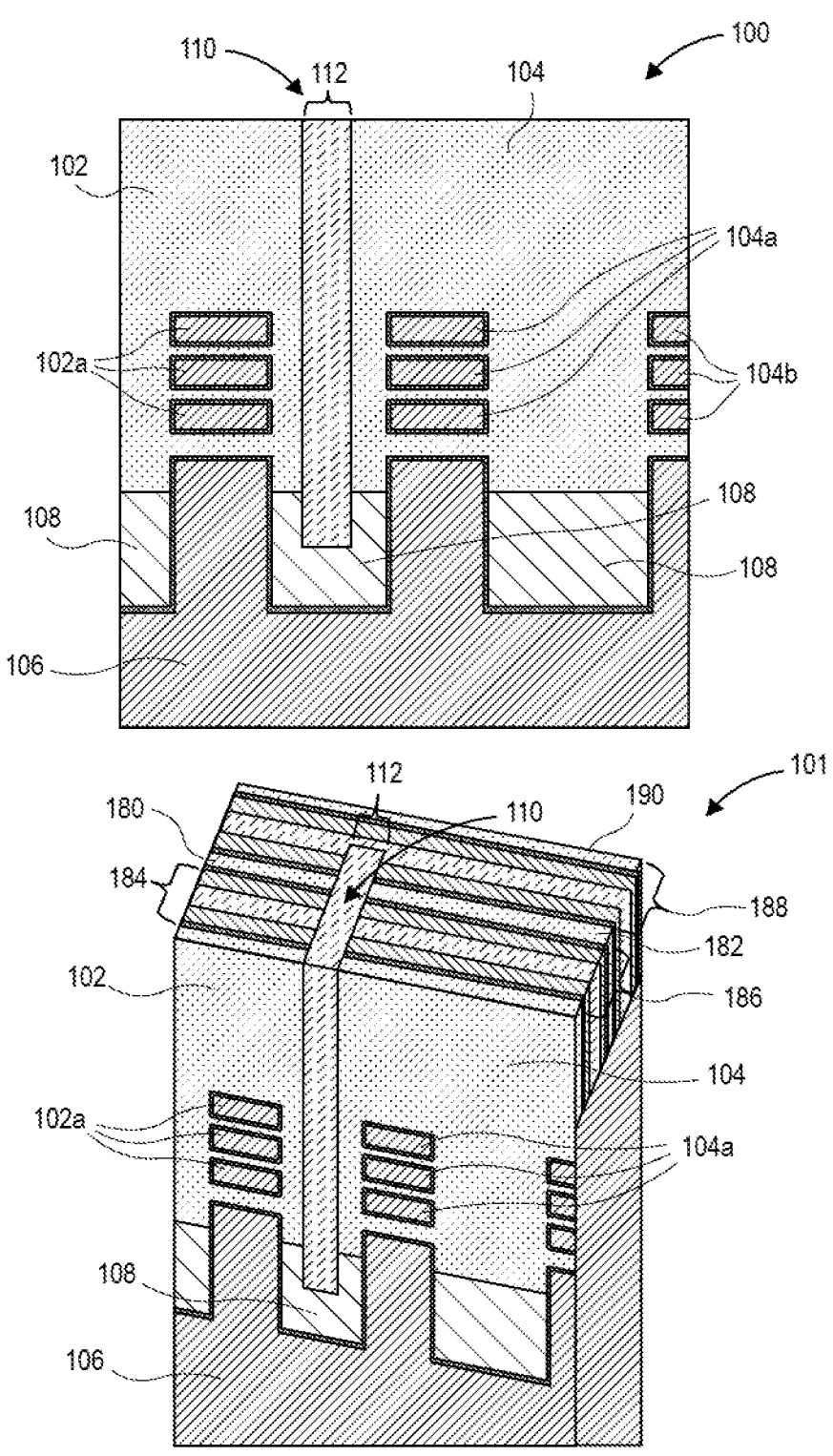
FIG. 1 illustrates a cross-section side view and a perspective view of a legacy semiconductor device that includes a gate cut.

Embodiments described herein may be related to apparatuses, processes, systems, and/or techniques for forming a wall within a metal gate cut in a transistor layer of a semiconductor device, where the wall includes a gap that is filled with a volume of a gas. In embodiments, the gap may be filled with air. In embodiments, the gap may include a gas other than air, which may include nitrogen or some other inert gas. In embodiments described herein, the gap may be referred to as an air gap within the wall, or may be referred to as an air gap on a metal gate cut. In embodiments, the wall separates a first metal gate from a second metal gate. In embodiments, a volume of air within a wall may serve to reduce the dielectric constant of the wall due to the dielectric constant of air being lower than the dielectric constant of other dielectric materials.

A metal gate cut, which may also be referred to as a gate cut, is a common occurrence in standard cells design, as well as bit cell design for transistor structures within a semiconductor device. In nodes, in order to be able to do a shorter extension of gate over an active channel, a non-selective etch for the metal cut is used, which may be referred to as a non-selective metal gate cut. Non-selective metal gate cut also introduces a cut in areas aligned to the trench, or diffusion, contact. Therefore, the dielectric constant of the material used in filling the non-selective gate cut has a significant impact on the capacitance of the transistor device. This impact on capacitance in turn affects the performance of the standard cells and memory.

One of the limiting factors in the standard cell design is the gate cut and its implications to the routing layers. Gate cuts occur at the top and bottom of a cell boundary and at the center of the standard cells. In order to increase the drive per given area, active transistor channel distances may be reduced, so that the active channel area per cell height is maximized. This in turn allows cell height scaling in successive technologies.

Thus, as the active channel area distances for nmos and pmos devices are reduced, another determinant of scaling becomes the minimum gate end extension required to fully control the active channel. In legacy implementations, the gate cut was accomplished by plugging the grating that would define the metal gate, and after the metal fill, a polish process would grind the wafer until the top of the plugged section is revealed, forming a plug in the gate cut.

As the gate plug in the gate cut gets closer to the channel for scaling purposes, legacy processes have a challenge to fill the small distance between the active channel and the plug in the gate cut. In legacy implementations, this led to the use of non-selective metal gate process, where the gate is cut after the metal fill using a non-selective etch, circumventing the difficulties associated with metal fill of a high aspect ratio, small volume hole in the gate cut.

However, the non-selective metal gate cut process cuts beyond the area aligned to the desired gate, extending to areas aligned to trench, or diffusion, area. Therefore, the dielectric constant associated with a plug in the cut area has a significant impact on how much the transistors are parasitically coupling to each other.

In embodiments described herein, a plug in a metal gate cut, which may also be referred to as a wall formed in a gate cut, may incorporate a volume of air, or an air gap, as part of the wall. Because the dielectric constant of air is lower than other dielectric materials, leaving an air gap in the wall rather than a dielectric material can result in significant improvements in device performance.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 illustrates a cross-section side view and a perspective view of a legacy semiconductor device that includes a gate cut. The legacy semiconductor device 100 is a cross-section side view that shows a first metal gate 102 that has a plurality of nanoribbons 102a within the first metal gate 102 that are in a stacked formation. In embodiments, the plurality of nanoribbons may be referred to as a nanoribbon stack.

Legacy semiconductor device 100 also includes a second metal gate 104 that has a first plurality of nanoribbons 104a in a stacked formation and a second plurality of nanoribbons 104b also in a stacked formation within the second metal gate 104. In implementations, the plurality of nanoribbons 102a, 104a, 104b are above a substrate 106. The substrate 106 may be referred to as a sub-fin or a sub-ribbon, that may include wafer silicon. In implementations, a dielectric 108 is above portions of the substrate 106. The dielectric 108 may be referred to as an isolation dielectric.

A gate cut 110 extends from a top of the first metal gate 102 and the top of the second metal gate 104 and into the dielectric 108. As shown, the gate cut 110 extends below a bottom of the plurality of nanoribbons 102a, 104a. The gate cut 110 extends below the first metal gate 102 and the second metal gate 104, electrically isolating the first metal gate 102 and the second metal gate 104 from each other. The gate cut 110 is filled with a plug 112, which may include a dielectric that may include $SiO_2$, SiN, SiCN, or SiOC.

Diagram 101 is a perspective view of legacy semiconductor device 100, and shows a first metal gate 102 and a second metal gate 104 that are separated by the gate cut 110, where the gate cut 110 extends through a first layer 184 to a third metal gate 180 and also extends through a second layer 186 to a fourth metal gate 182. The gate cut 110 also extends partially through a third layer 188. A fifth metal gate 190 is coupled with the third layer 188. The first layer 184, second layer 186, and third layer 188 include dielectric material, epitaxial material, or a contact metal. The gate cut 110 as a result electrically isolates the third metal gate 180 from the fourth metal gate 182.

Figure 2:
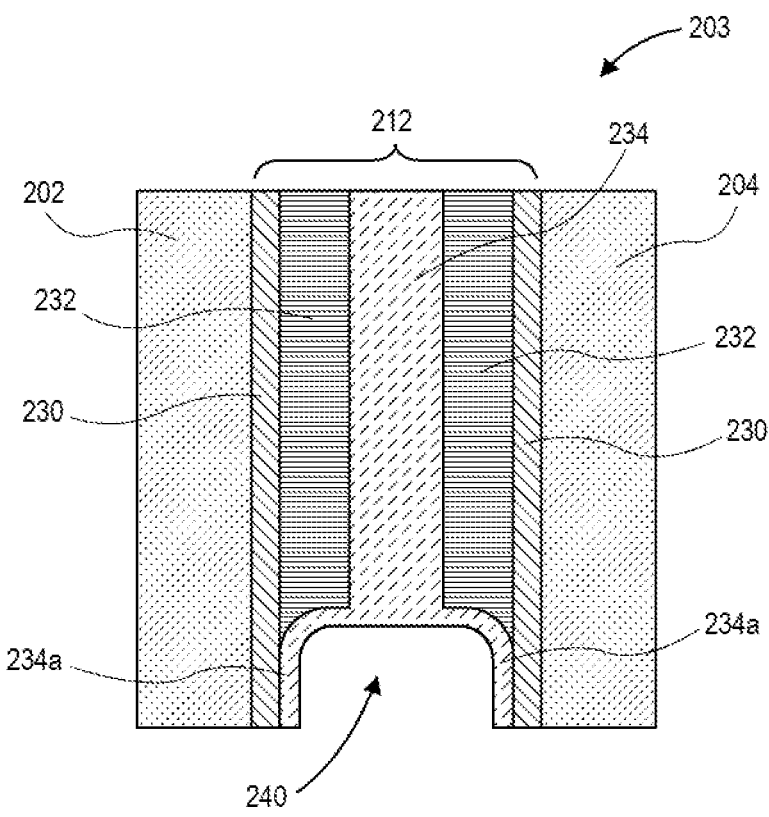
FIG. 2 illustrates cross-section side views and a perspective view of a semiconductor device with a wall that includes a volume of air, in accordance with various embodiments.

FIG. 2 illustrates cross-section side views and a perspective view of a semiconductor device with a wall that includes a volume of air, in accordance with various embodiments. Semiconductor device 200, which may be similar to legacy semiconductor device 100 of FIG. 1, is a cross-section side view of an embodiment that shows a first metal gate 202 that has a plurality of nanoribbons 202a within the first metal gate 202 that are in a stacked formation. A second metal gate 204 has a first plurality of nanoribbons 204a in a stacked formation and a second plurality of nanoribbons 204b also within the second metal gate 204 in a stacked formation. In embodiments, the plurality of nanoribbons 202a, 204a, 204b are above a substrate 206, which may be referred to as a sub-fin or a sub-ribbon, and a dielectric 208, which may be referred to as an isolation dielectric, is above portions of the substrate 206.

In embodiments, a gate cut 210, which may be similar to gate cut 110 of FIG. 1, extends from a top of the first metal gate 202 and the top of the second metal gate 204 and into the dielectric 208. In embodiments, the gate cut 210 extends below a bottom of the plurality of nanoribbons 202a, 204a. In embodiments, the gate cut 210 extends below the first metal gate 202 and the second metal gate 204, electrically isolating the first metal gate 202 and the second metal gate 204 from each other. The gate cut 210 is filled with a wall 212.

In embodiments, the wall 212 may include a first liner 230 on an outer side of the wall 212, and a second liner 232 on a portion of the first liner 230 proximate to the top of the wall 212a. In embodiments, third liner 234 may be proximate to the top of the wall 212a and between the first liner 230 and the second liner 232. In embodiments, the first liner 230 and the third liner 234 may completely surround or may partially surround a volume of air 240 within the wall 212. In embodiments, a portion of the third liner 234a may be on the first liner 230. In some embodiments, the first liner 230 and/or the second liner 232 may not be present or may be partially present. In some embodiments, there may be additional liners (not shown) included in the wall 212 that may surround the volume of air 240.

In embodiments, the first liner 230 may include silicon, nitrogen, carbon, oxygen, SiN, SiC, SiO, and/or SiCN. In embodiments, the second liner 232 may include silicon, nitrogen, carbon, oxygen, SiN, SiC, SiO, and/or SiCN. In embodiments, the third liner 234 may include silicon, nitrogen, carbon, oxygen, SiN, SiC, SiO, and/or SiCN. Diagram 203 shows an expanded view of area 203 of semiconductor device 200.

Diagram 201 shows a perspective view of an embodiment of semiconductor device 200 that includes a first metal gate 202 and a second metal gate 204 that are separated by wall 212 where the wall 212 extends through a first layer 284 to a third metal gate 280 and also extends through a second layer 286 to a fourth metal gate 282. The wall 212 also extends partially through a third layer 288. A fifth metal gate 290 may be coupled with the third layer 288. First layer 284, second layer 286, and third layer 288, may be similar to first layer 184, second layer 186, and third layer 188 of FIG. 1. In embodiments, the wall 212 electrically isolates the third metal gate 280 from the fourth metal gate 282.

In embodiments, the wall 212 includes the first liner 230, the second liner 232, and the third liner 234 that may partially or completely surround the volume of air 240.

Figure 3A:
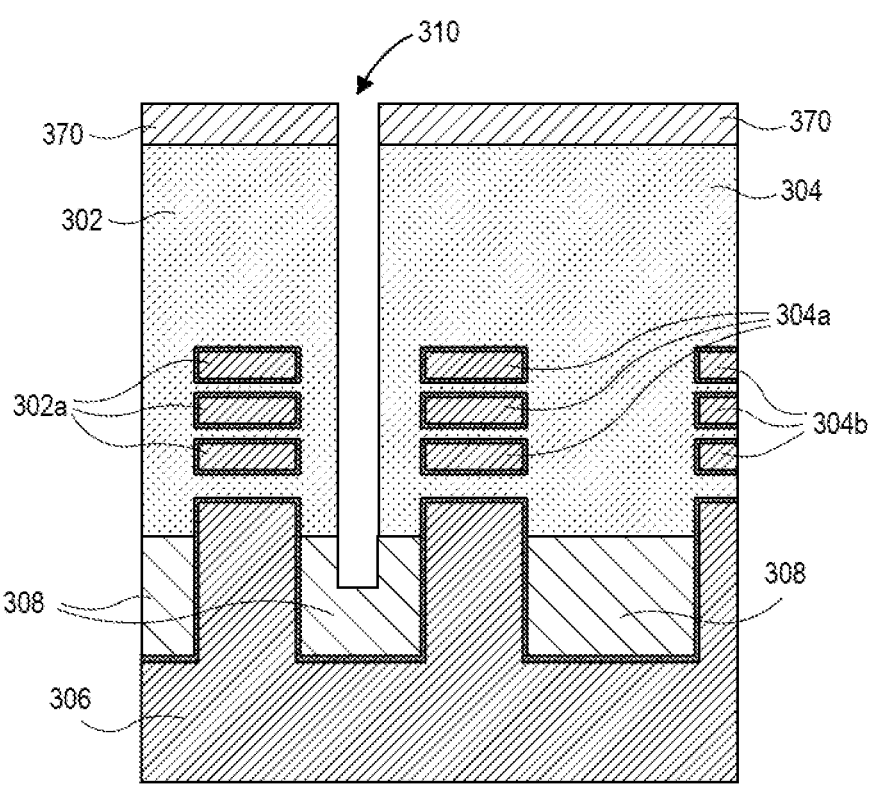
FIGS. 3A-3F illustrate cross-section side views of stages in a manufacturing process for a semiconductor device with a wall in the semiconductor device that includes a volume of air, in accordance with various embodiments.

FIGS. 3A-3F illustrate cross-section side views of stages in a manufacturing process for a semiconductor device with a wall in the semiconductor device that includes a volume of air, in accordance with various embodiments. FIG. 3A illustrates a cross-section side view of a stage in the manufacturing process that shows a semiconductor device, which may be similar to semiconductor device 200 of FIG. 2. A first metal gate 302 includes a plurality of nanoribbons 302a in a stacked formation within the first metal gate 302. A second metal gate 304 includes a first plurality of nanoribbons 304a in a stacked formation and a second plurality of nanoribbons 304b also in a stacked formation within the second metal gate 304. In embodiments, the plurality of nanoribbons 302a, 304a, 304b are above a substrate 306, which may be similar to substrate 206 of FIG. 2, and a dielectric 308, which may be similar to dielectric 208 of FIG. 2, is above portions of the substrate 306.

A protective layer 370 may be placed on a top of the first metal gate 302 and on a top of the second metal gate 304. In embodiments, at the time the protective layer 370 is placed, the first metal gate 302 and the second metal gate 304 may be a same metal gate. A gate cut 310, which may be similar to gate cut 210 of FIG. 2, may then be made through a top of the protective layer 370, where the gate cut 310, extends into the dielectric 308. As shown, the gate cut 310 extends below a bottom of the plurality of nanoribbons 302a, 304a. The gate cut 310 extends below the first metal gate 302 and the second metal gate 304, electrically isolating the first metal gate 302 and the second metal gate 304 from each other.

Figure 3B:
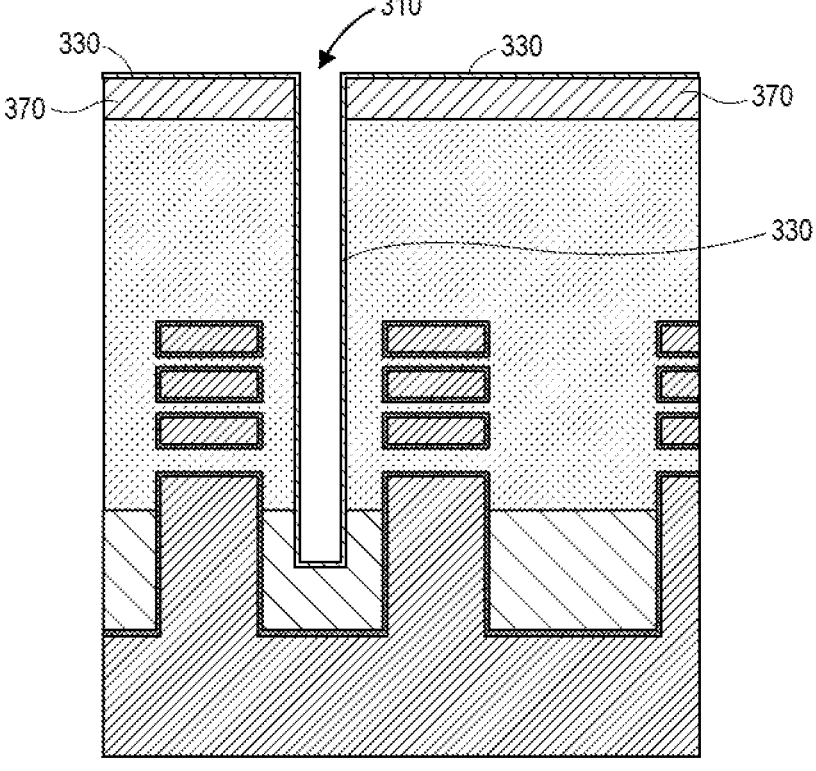

FIG. 3B illustrates a cross-section side view of a stage in the manufacturing process where a first liner 330, which may be similar to first liner 230 of FIG. 2, is deposited on a surface of the protective layer 370, as well as on the sides of the gate cut 310, using atomic layer deposition techniques.

Figure 3C:
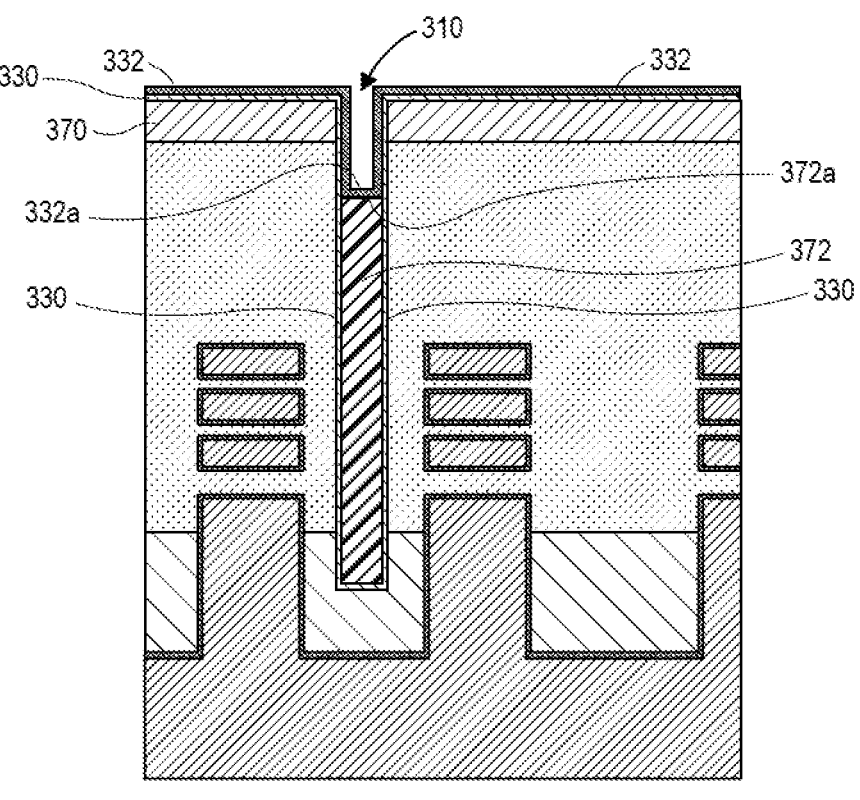

FIG. 3C illustrates a cross-section side view of a stage in the manufacturing process where a filler material 372, which may be a carbon hard mask, is inserted into the gate cut 310. In embodiments, the filler material 372 will be at least partially surrounded by the first liner 330. A second liner 332, which may be similar to second liner 232 of FIG. 2, may be placed on the first liner 330 including within the gate cut 310, where a bottom portion 332a of the second liner 332 may be on a top portion 372a of the filler material 372.

Figure 3D:
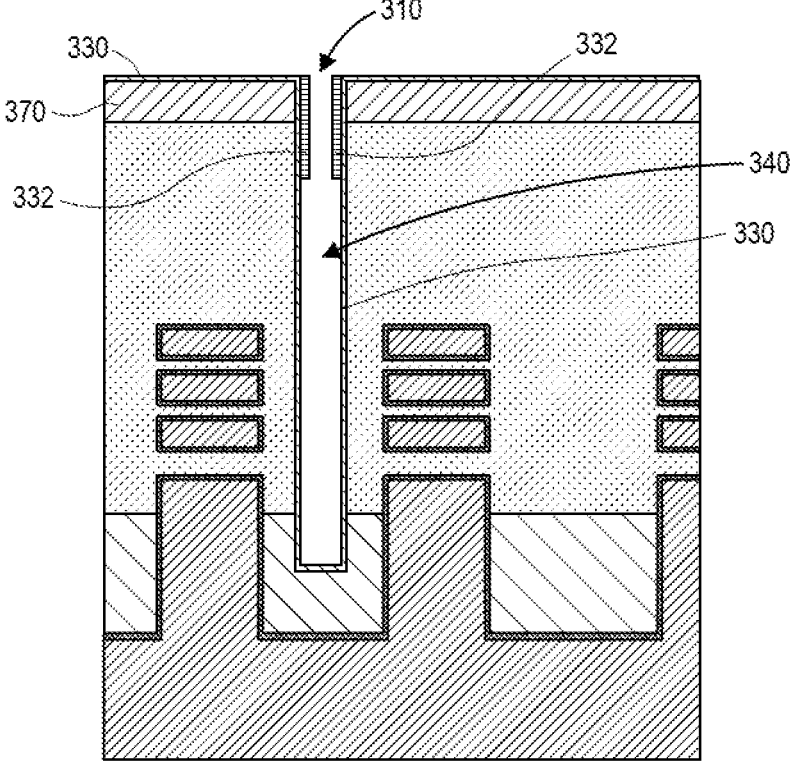

FIG. 3D illustrates a cross-section side view of a stage in the manufacturing process where an etch is performed to remove the bottom portion 332a of the second liner 332 in FIG. 3C. In embodiments, the same etch or a different etch may be used to remove the filler material 372 of FIG. 3C as well. In embodiments, this results in a volume of air 340, which may be similar to volume of air 240 of FIG. 2, within the gate cut 310. In embodiments, the etch may also remove the second liner 332 on top of the first liner 330 that is on the protective layer 370 as shown in FIG. 3C.

Figure 3E:
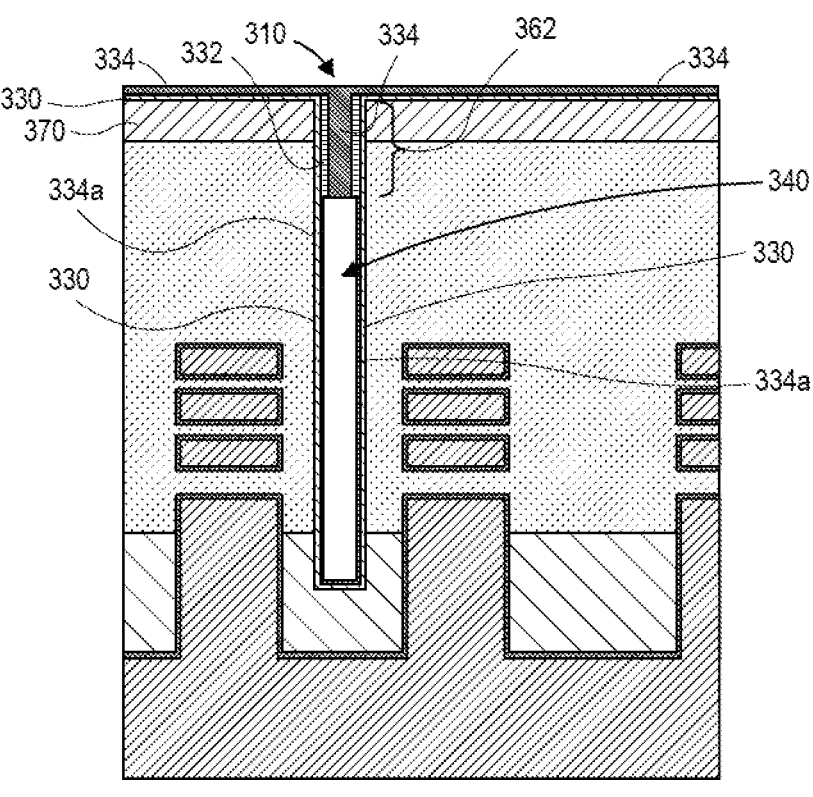

FIG. 3E illustrates a cross-section side view of a stage in the manufacturing process where a third liner 334, which may be similar to third liner 234 of FIG. 2, may be deposited on a surface of the first liner 330 and into the gate cut 310. In embodiments, the third liner 334 may be deposited using atomic layer deposition techniques.

In embodiments, the third liner 334 may completely fill up a region 362 in the gate cut 310 between the second liner 332 and a top of the gate cut 310. As a result, the volume of air 340 is encapsulated within the gate cut 310. In embodiments, a portion 334a of the third liner 334 may be deposited around the edges of the volume of air 340 on the first liner 330. In embodiments, the third liner 334 may seal the volume of air 340 by pinching off the opening at the top of the volume of air 340.

Figure 3F:
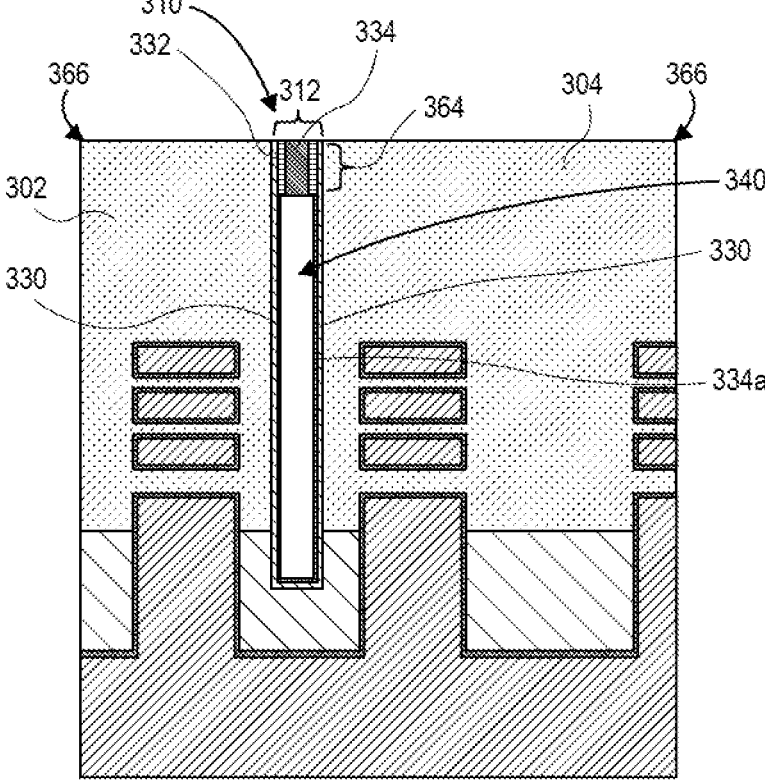

FIG. 3F illustrates a cross-section side view of a stage in the manufacturing process where a planarization process occurs to remove the protective layer 370 of FIG. 3E, forming wall 312 and exposing a top of the first metal gate 302, a top of the second metal gate 304, and a top of the wall 312 that are in a same plane 366. In embodiments, the wall 312 includes the first liner 330, the second liner 332, and the third liner 334 within the region 364 of the gate cut 310, which may be similar to region 362 of the gate cut 310 of FIG. 3E, that encloses the volume of air 340. In embodiments, the first liner 330 may form all or part of the outer portion of the wall 312. In embodiments, portions 334a of the third liner 334 may surround all or part of the volume of air 340.

Figure 4:
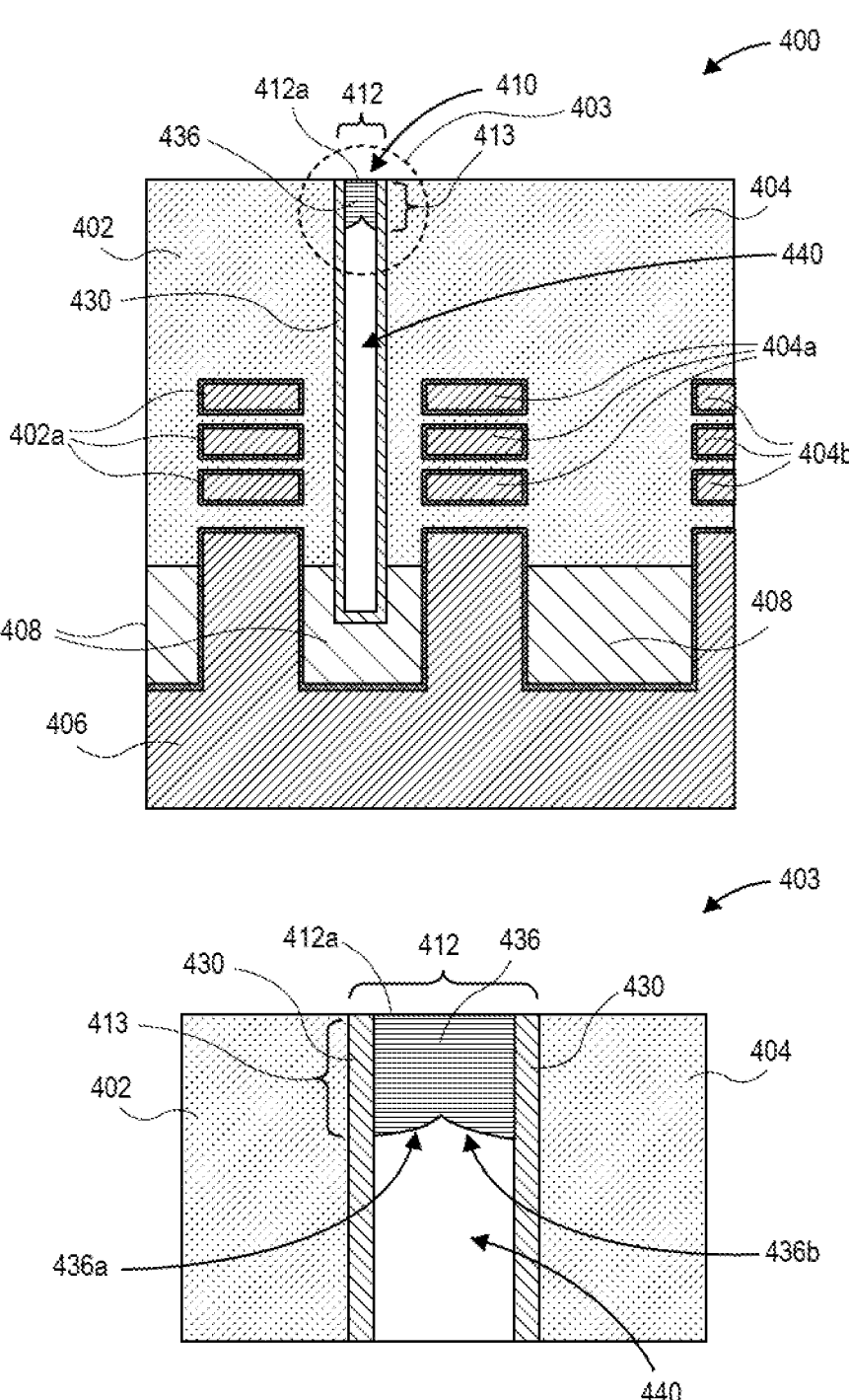
FIG. 4 illustrates a cross-section side view and a perspective view of another embodiment of a semiconductor device with a wall in the semiconductor that includes a cap to enclose a volume of air within the wall, in accordance with various embodiments.
Figure 4:
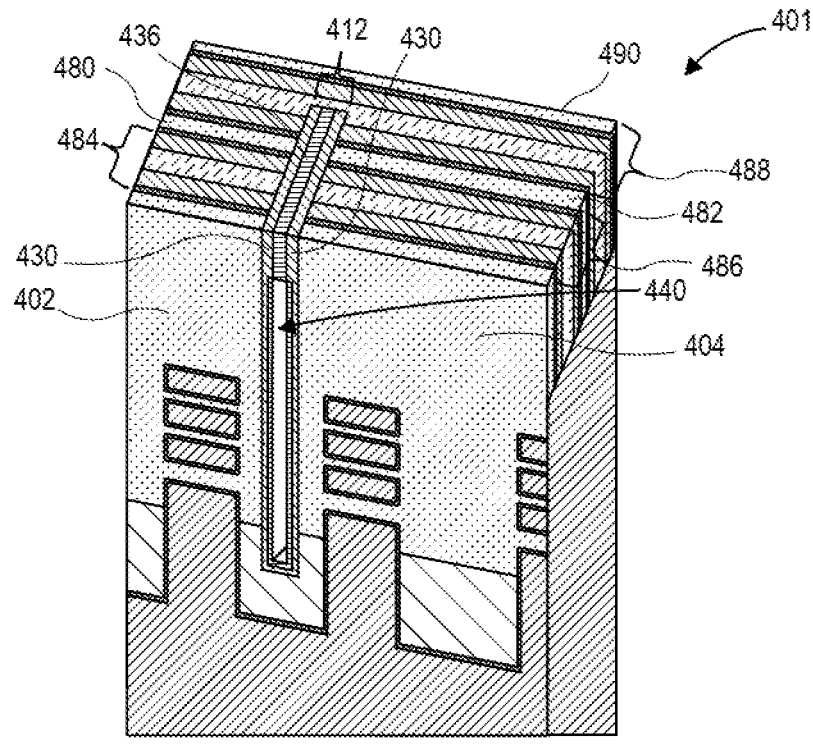

FIG. 4 illustrates a cross-section side view and a perspective view of another embodiment of a semiconductor device with a wall in the semiconductor that includes a cap to enclose a volume of air within the wall, in accordance with various embodiments. Semiconductor device 400, which may be similar to semiconductor device 200 of FIG. 2, is a cross-section side view of an embodiment that shows a first metal gate 402 that has a plurality of nanoribbons 402a within the first metal gate 402 that are in a stacked formation within the first metal gate 402. A second metal gate 404 that has a first plurality of nanoribbons 404a in a stacked formation and a second plurality of nanoribbons 404b also in a stacked formation within the second metal gate 404. In embodiments, the plurality of nanoribbons 402a, 404a, 404b are above a substrate 406, which may be similar to substrate 306 of FIG. 3A and a dielectric 408, which may be similar to dielectric 308 of FIG. 3A, is above portions of the substrate 406.

A gate cut 410, which may be similar to gate cut 110 of FIG. 1, extends from a top of the first metal gate 402 and the top of the second metal gate 404 and into the dielectric 408. As shown, the gate cut 410 extends below a bottom of the plurality of nanoribbons 402a, 404a. The gate cut 410 extends below the first metal gate 402 and below the second metal gate 404, electrically isolating the first metal gate 402 and the second metal gate 404 from each other. The gate cut 410 is filled with a wall 412, which may be similar to wall 212 of FIG. 2.

In embodiments, the wall 412 may include a first liner 430, which may be similar to first liner 230 of FIG. 2, on an outer side of the wall 412, and a second liner 436 on a portion of the first liner 430 proximate to the top of the wall 412a. In embodiments, the first liner 430 and the second liner 436 together may completely surround or may partially surround a volume of air 440, which may be similar to volume of air 240 of FIG. 2, within the wall 412. In embodiments, this portion of the first liner 430 and the second liner 436 may be referred to as a cap 413. In some embodiments, the first liner 430 may not be present or may be partially present. In some embodiments, there may be additional liners (not shown) that make up the wall 412 that surrounds the volume of air 440.

In embodiments, the first liner 430 may include silicon, nitrogen, carbon, oxygen, SiN, SiC, SiO, and/or SiCN. In embodiments, the second liner 436 may include silicon, nitrogen, carbon, oxygen, SiN, SiC, SiO, and/or SiCN.

Diagram 403 shows an expanded view of area 403 on semiconductor device 400. In particular, second liner 436, above the volume of air 440 may include an uneven surface. For example, the center of the surface 436b of the second liner 436 may be closer to the top of the wall 412a, and the edges of the surface 436a of the second liner 436 may be further away from the top of the wall 412a. In embodiments described further below, this may be due to the deposition process of the second liner 436.

Diagram 401 shows a perspective view of an embodiment of semiconductor device 400 that includes a first metal gate 402 and a second metal gate 404 that are separated by wall 412 where the wall 412 extends through a first layer 484 to a third metal gate 480 and also extends through a second layer 486 to a fourth metal gate 482. The wall 412 also extends partially through a third layer 488. First layer 484, second layer 486, and third layer 488, may be similar to first layer 284, second layer 286, and third layer 288 of FIG. 2. A fifth metal gate 490 may be coupled with the third layer 488. The wall 412 as a result electrically isolates the third metal gate 480 from the fourth metal gate 482.

Figure 5A:
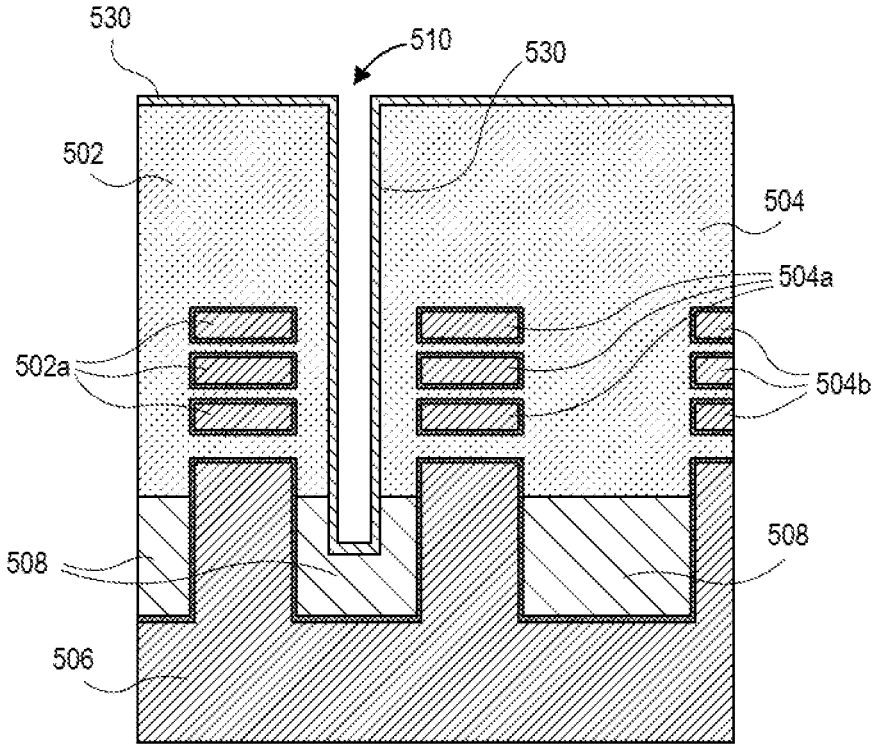
FIGS. 5A-5C illustrate cross-section side perspectives of stages in a manufacturing process for a semiconductor device with a wall in the semiconductor device that includes a cap to enclose a volume of air within the wall, in accordance with various embodiments.
Figure 5B:
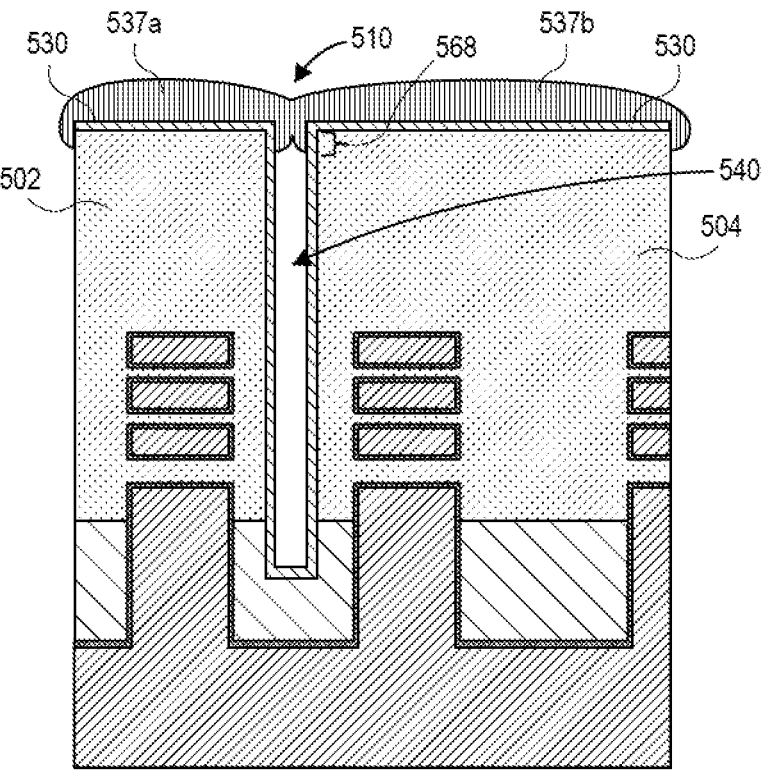
Figure 5C:
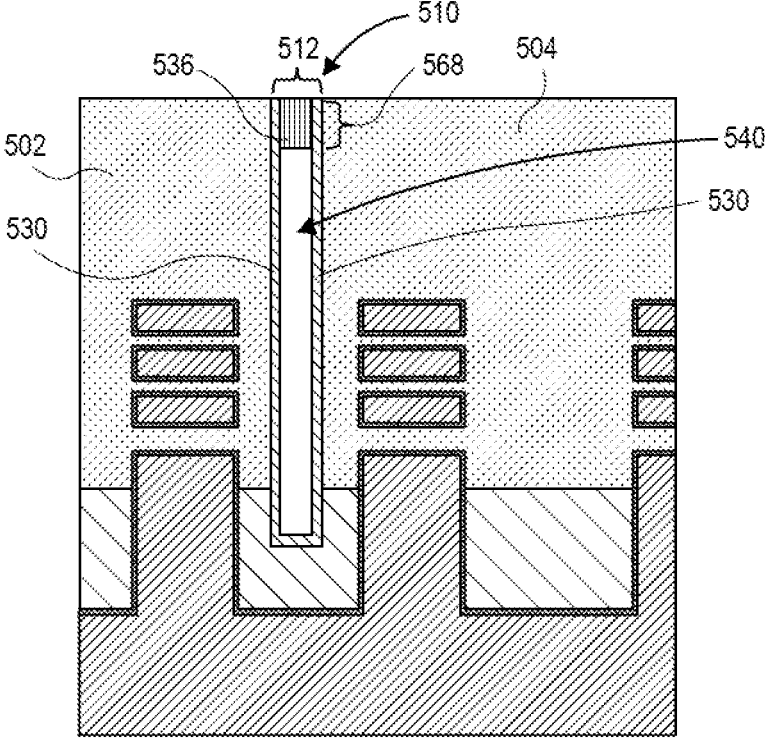

FIGS. 5A-5C illustrate cross-section side perspectives of stages in a manufacturing process for a semiconductor device with a wall in the semiconductor device that includes a cap to enclose a volume of air within the wall, in accordance with various embodiments.

FIG. 5A illustrates a cross-section side view of a stage in the manufacturing process that shows a semiconductor device, which may be similar to semiconductor device 400 of FIG. 4, that includes first metal gate 502 that has a plurality of nanoribbons 502a within the first metal gate 502 that are in a stacked formation. In embodiments, there is a second metal gate 504 that has a first plurality of nanoribbons 504a in a stacked formation and a second plurality of nanoribbons 504b also in a stacked formation within the metal gate 504. In embodiments, the plurality of nanoribbons 502a, 504a, 504b are above a substrate 506, which may be similar to substrate 406 of FIG. 4, and a dielectric 508, which may be similar to a dielectric 408 of FIG. 4, is above portions of the substrate 506.

In embodiments, a gate cut 510 which may be similar to gate cut 410 of FIG. 4, has been made that extends into the dielectric 508. As shown, the gate cut 510 extends below a bottom of the plurality of nanoribbons 502a, 504a. The gate cut 510 extends below the first metal gate 502 and the second metal gate 504, electrically isolating the first metal gate 502 and the second metal gate 504 from each other.

In embodiments, a first liner 530, which may be similar to first liner 430 of FIG. 4, may be applied on the first metal gate 502, on the second metal gate 504, and around the walls and bottom of gate cut 510. In some embodiments, the first liner 530 may only be placed around multiple sides of the first metal gate 502, or around multiple sides of the second metal gate 504.

FIG. 5B illustrates a cross-section side view of a stage in the manufacturing process where a first portion of the second liner 537a, which may be similar to second liner 436 of FIG. 4, may be grown on top of the first liner 530 that is on top of the first metal gate 502. In embodiments, a second portion of the second liner 537b, which may be similar to second liner 436 of FIG. 4, may be grown on top of the second metal gate 504. In embodiments, the first portion of the second liner 537a and the second portion of the second liner 537b may be grown using physical vapor deposition (PVD) or sputter deposition techniques.

In embodiments, as growth continues, the first portion of the second liner 537a and the second portion of the second liner 537b may grow together and may grow down into the gate cut 510 into a top region 568 of the gate cut 510. In other embodiments, there may be multiple areas on a surface of the semiconductor device, such as semiconductor device 400, onto which a portion of a liner, for example a first portion of the second liner 537a, may be grown.

FIG. 5C illustrates a cross-section side view of a stage in the manufacturing process where a polish may be performed to remove the first portion of the second liner 537a, the second portion of the second liner 537b, and the first liner 530 that is at the top of the first metal gate 502 and the second metal gate 504. The result is a wall 512 that includes the first liner 530 around the inside of the gate cut 510, and the second liner 536 in the top region 568 of the gate cut 510, where the first liner 530 and the second liner 536 encapsulate a volume of air 540 within wall 512. In embodiments, the top region 568 may be referred to as a cap.

FIG. 6 illustrates a top-down cross-section view of a semiconductor device with different designs of a wall that include a volume of air within the wall, in accordance with various embodiments. Semiconductor device 600, which may be similar to semiconductor device 200 of FIG. 2, or which may be similar to semiconductor device 400 of FIG. 4, shows a top-down view that includes a first wall 692, a second wall 694, and a third wall 696, which may be similar to wall 212 of FIG. 2, wall 312 of FIG. 3F, wall 412 of FIG. 4, or wall 512 of FIG. 5C that include a volume of air.

In embodiments, the first wall 692 may have a planar shape, that may take the form of a traditional gate cut, such as gate cut 210 of FIG. 2. In other embodiments, the second wall 694 may have a curved shape, for example an "S" shape. In other embodiments, the third wall 696 may have angles, for example a 90° angle, within the wall. In each of these embodiments, a volume of air, similar to volume of air 240 of FIG. 2 or volume of air 440 of FIG. 4, may be within each of the walls 692, 694, 696.

FIG. 7 illustrates an example process for manufacturing a semiconductor device that includes a wall that includes a volume of air, in accordance with various embodiments. Process 700 may be performed using the apparatus, systems, processes, and/or techniques described herein, and in particular with respect to FIGS. 1-6.

At block 702, the process may include providing a semiconductor device that includes a first stack of nanoribbons surrounded by a first metal and a second stack of nanoribbons surrounded by a second metal. In embodiments, the semiconductor device may be similar to semiconductor device 200 of FIG. 2, or may be similar to semiconductor device 400 of FIG. 4. In embodiments, the first stack of nanoribbons may be similar to plurality of nanoribbons 202a and the first metal may be similar to first metal gate 202 of FIG. 2. In embodiments, the second stack of nanoribbons may be similar to plurality of nanoribbons 204a and the second metal may be similar to second metal gate 204 of FIG. 2.

At block 704, the process may further include forming a wall in the semiconductor device between the first metal gate and the second metal gate, wherein the wall electrically isolates the first metal and the second metal from each other, and wherein the wall includes a volume of air. In embodiments, the wall may be similar to wall 212 and the volume of air may be similar to volume of air 240 of FIG. 2. In embodiments, the wall may be similar to wall 412 and the volume of air may be similar to volume of air 440 of FIG. 4.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 8:
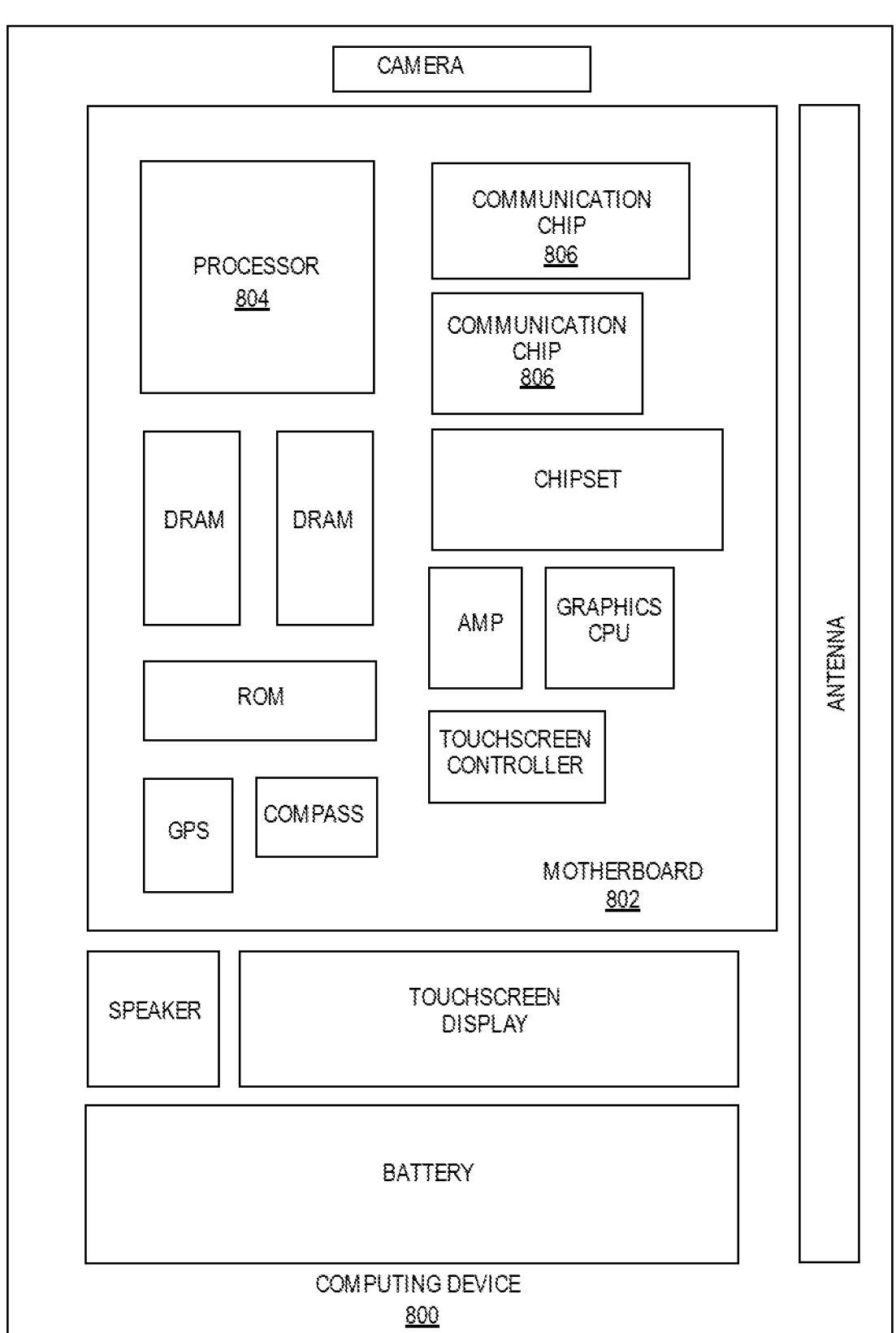
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
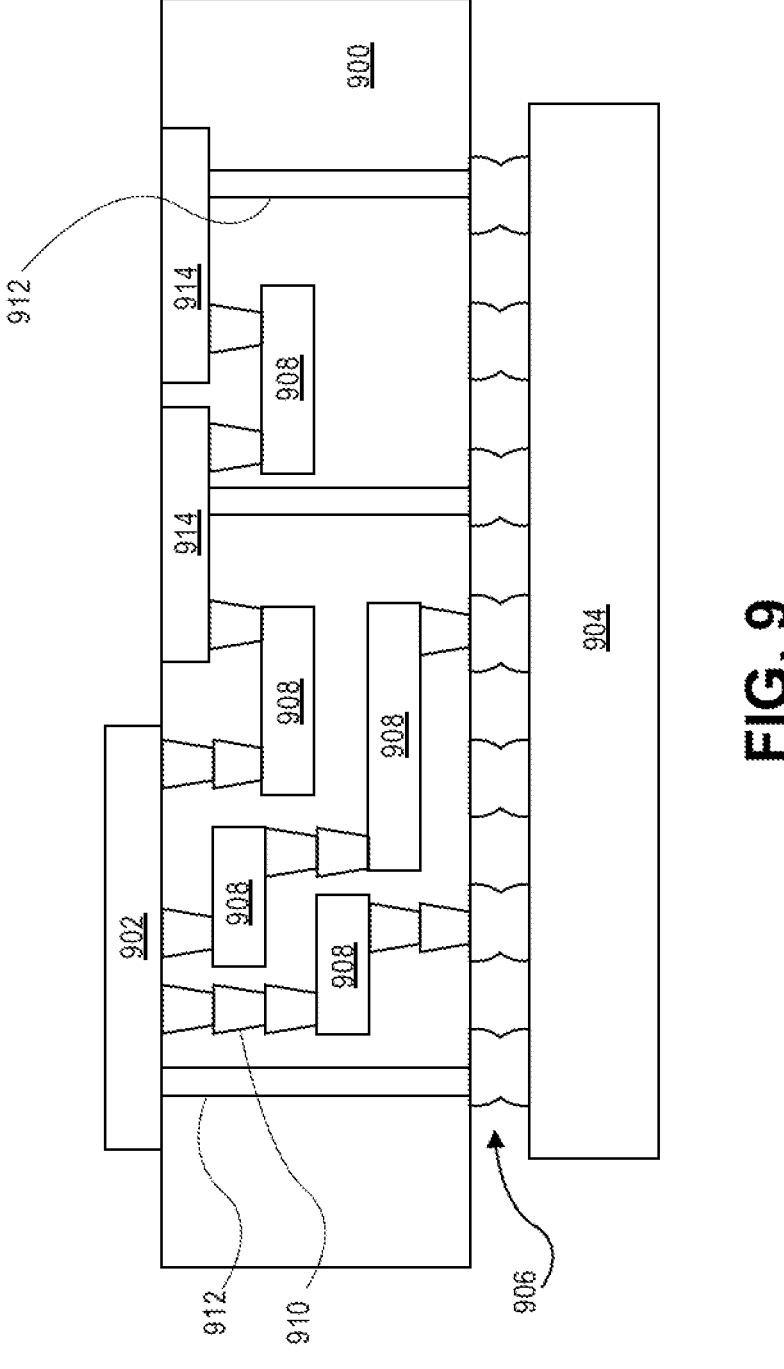
FIG. 9 illustrates an interposer that includes one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a semiconductor device comprising: a first stack of one or more nanoribbons; a second stack of one or more nanoribbons; a wall between the first stack of the one or more nanoribbons and the second stack of the one or more nanoribbons, wherein the wall extends from below a bottom of the first stack of the one or more nanoribbons and below a bottom of the second stack of the one or more nanoribbons to above a top of the first stack of the one or more nanoribbons and to above a top of the second stack of the one or more nanoribbons; and wherein the wall includes a volume of a gas.

Example 2 includes the semiconductor device of example 1, further comprising: a first metal surrounding the first stack of one or more nanoribbons; a second metal surrounding the second stack of one or more nanoribbons; and wherein the wall electrically isolates the first metal from the second metal.

Example 3 includes the semiconductor device of example 2, wherein the first metal and the first stack of the one or more nanoribbons form a first transistor gate structure, and wherein the second metal and the second stack of the one or more nanoribbons form a second transistor gate structure.

Example 4 includes the semiconductor device of examples 2 or 3, wherein a portion of the first metal is physically coupled to a first side of the wall, and wherein a portion of the second metal is physically coupled to a second side of the wall opposite the first side of the wall.

Example 5 includes the semiconductor device of examples 2, 3, or 4, wherein the wall extends into a layer of dielectric that is below the first metal and below the second metal.

Example 6 includes the semiconductor device of examples 1, 2, 3, 4, or 5, wherein the volume of the gas in the wall is between the first stack of the one or more nanoribbons and the second stack of the one or more nanoribbons.

Example 7 includes the semiconductor device of examples 1, 2, 3, 4, 5, or 6, wherein the wall includes an outer portion that at least partially includes a liner, wherein the liner at least partially surrounds the volume of the gas.

Example 8 includes the semiconductor device of example 7, wherein the liner includes a selected one or more of: silicon, nitrogen, carbon, oxygen, SiN, SiC, SiO, or SiCN.

Example 9 includes the semiconductor device of examples 7 or 8, wherein the liner is a first liner; and further comprising: one or more second liners on the first liner, wherein the one or more second liners form a top of the wall; and wherein the first liner and the one or more second liners enclose the volume of the gas.

Example 10 includes a semiconductor device of example 9, wherein the second liner includes a selected one or more of: silicon, nitrogen, carbon, oxygen, SiN, SiC, SiO, or SiCN.

Example 11 includes a semiconductor device of examples 7, 8, 9, or 10, further comprising a cap at the top of the wall, wherein the cap and the liner enclose the volume of the gas.

Example 12 includes the semiconductor device of example 11, wherein the cap includes the liner.

Example 13 includes the semiconductor device of examples 1, 2, 3, 4, 5, 6, 7, 8, 9, 10, 11, or 12, wherein the gas includes a selected one or more of: air, nitrogen, or an inert gas.

Example 14 is a semiconductor device comprising: a first stack of nanoribbons surrounded by a first metal gate; a second stack of nanoribbons surrounded by a second metal gate; and a wall between the first stack of nanoribbons and the second stack of nanoribbons, wherein the wall electrically isolates the first metal gate and the second metal gate from each other, and wherein the wall includes a volume of a gas.

Example 15 includes the semiconductor device of example 14, wherein the volume of the gas is between the first stack of nanoribbons and the second stack of nanoribbons.

Example 16 includes the semiconductor device of examples 14 or 15, further comprising: a third stack of nanoribbons surrounded by a third metal gate; a fourth stack of nanoribbons surrounded by a fourth metal gate; and wherein the wall electrically isolates the third metal gate and the fourth metal gate from each other.

Example 17 includes the semiconductor device of example 16, further comprising: a first epitaxial layer between the first stack of nanoribbons and the third stack of nanoribbons; a second epitaxial layer between the second stack of nanoribbons and the third stack of nanoribbons; and wherein the wall separates the first epitaxial layer and the second epitaxial layer from each other.

Example 18 includes the semiconductor device of examples 14, 15, 16, or 17, wherein the wall includes a liner.

Example 19 includes the semiconductor device of example 18, wherein the liner includes a selected one or more of: silicon, nitrogen, carbon, oxygen, SiN, SiC, SiO, or SiCN.

Example 20 includes the semiconductor device of claim 18, wherein the wall includes a cap, wherein the cap and the liner enclose the volume of the gas.

Example 21 is a method comprising: providing a semiconductor device that includes a first stack of nanoribbons surrounded by a first metal and a second stack of nanoribbons surrounded by a second metal; and forming a wall in the semiconductor device between the first metal gate and the second metal gate, wherein the wall electrically isolates the first metal and the second metal from each other, and wherein the wall includes a volume of a gas.

Example 22 includes the method of example 21, wherein forming the wall further includes performing a gate cut in the semiconductor device between the first metal gate and the second metal gate.

Example 23 includes the method of example 22, wherein forming the wall further includes placing a liner within the gate cut, wherein the liner at least partially surrounds the volume of the gas.

Example 24 includes the method of example 23, wherein forming the wall further comprising placing a cap on a top of the gate cut, wherein the cap and the liner enclose the volume of the gas.

Example 25 includes the method of examples 23 or 24, wherein the liner includes a selected one or more of: silicon, nitrogen, carbon, oxygen, SiN, SiC, SiO, or SiCN.

What is claimed is:

1. A semiconductor device comprising:
a first stack of one or more nanoribbons;
a second stack of one or more nanoribbons;
a wall between the first stack of the one or more nanoribbons and the second stack of the one or more nanoribbons, wherein the wall extends from below a bottom of the first stack of the one or more nanoribbons and below a bottom of the second stack of the one or more nanoribbons to above a top of the first stack of the one or more nanoribbons and to above a top of the second stack of the one or more nanoribbons;
wherein the wall includes a volume of a gas;
a first metal surrounding the first stack of one or more nanoribbons; and
a second metal surrounding the second stack of one or more nanoribbons, wherein the volume of the gas of the wall extends to below a bottom of the first metal and a bottom of the second metal.

2. The semiconductor device of claim 1, wherein the wall electrically isolates the first metal from the second metal.

3. The semiconductor device of claim 2, wherein the first metal and the first stack of the one or more nanoribbons form a first transistor gate structure, and wherein the second metal and the second stack of the one or more nanoribbons form a second transistor gate structure.

4. The semiconductor device of claim 2, wherein a portion of the first metal is physically coupled to a first side of the wall, and wherein a portion of the second metal is physically coupled to a second side of the wall opposite the first side of the wall.

5. The semiconductor device of claim 2, wherein the wall extends into a layer of dielectric that is below the first metal and below the second metal.

6. The semiconductor device of claim 1, wherein the volume of the gas in the wall is between the first stack of the one or more nanoribbons and the second stack of the one or more nanoribbons.

7. The semiconductor device of claim 1, wherein the wall includes an outer portion that at least partially includes a liner, wherein the liner at least partially surrounds the volume of the gas.

8. The semiconductor device of claim 7, wherein the liner includes a selected one or more of: silicon, nitrogen, carbon, oxygen, SiN, SiC, SiO, or SiCN.

9. The semiconductor device of claim 7, wherein the liner is a first liner; and further comprising:
one or more second liners on the first liner, wherein the one or more second liners form a top of the wall; and
wherein the first liner and the one or more second liners enclose the volume of the gas.

10. The semiconductor device of claim 9, wherein the second liner includes a selected one or more of: silicon, nitrogen, carbon, oxygen, SiN, SiC, SiO, or SiCN.

11. The semiconductor device of claim 7, further comprising a cap at the top of the wall, wherein the cap and the liner enclose the volume of the gas.

12. The semiconductor device of claim 11, wherein the cap includes the liner.

13. The semiconductor device of claim 1, wherein the gas includes a selected one or more of: air, nitrogen, or an inert gas.

14. A semiconductor device comprising:
a first stack of nanoribbons surrounded by a first metal gate;
a second stack of nanoribbons surrounded by a second metal gate; and
a wall between the first stack of nanoribbons and the second stack of nanoribbons, wherein the wall electrically isolates the first metal gate and the second metal gate from each other, and wherein the wall includes a volume of a gas, wherein the volume of the gas of the wall extends to below a bottom of the first metal gate and a bottom of the second metal gate.

15. The semiconductor device of claim 14, wherein the volume of the gas is between the first stack of nanoribbons and the second stack of nanoribbons.

16. The semiconductor device of claim 14, further comprising:
a third stack of nanoribbons surrounded by a third metal gate;
a fourth stack of nanoribbons surrounded by a fourth metal gate; and
wherein the wall electrically isolates the third metal gate and the fourth metal gate from each other.

17. The semiconductor device of claim 16, further comprising:
a first epitaxial layer between the first stack of nanoribbons and the third stack of nanoribbons;
a second epitaxial layer between the second stack of nanoribbons and the third stack of nanoribbons; and
wherein the wall separates the first epitaxial layer and the second epitaxial layer from each other.

18. The semiconductor device of claim 14, wherein the wall includes a liner.

19. The semiconductor device of claim 18, wherein the liner includes a selected one or more of: silicon, nitrogen, carbon, oxygen, SiN, SiC, SiO, or SiCN.

20. The semiconductor device of claim 18, wherein the wall includes a cap, wherein the cap and the liner enclose the volume of the gas.

21. A method comprising:

providing a semiconductor device that includes a first stack of nanoribbons surrounded by a first metal and a second stack of nanoribbons surrounded by a second metal; and forming a wall in the semiconductor device between the first metal and the second metal, wherein the wall electrically isolates the first metal and the second metal from each other, and wherein the wall includes a volume of a gas, wherein the volume of the gas of the wall extends to below a bottom of the first metal and a bottom of the second metal.

22. The method of claim 21, wherein forming the wall further includes performing a gate cut in the semiconductor device between the first metal and the second metal.

23. The method of claim 22, wherein forming the wall further includes placing a liner within the gate cut, wherein the liner at least partially surrounds the volume of the gas.

24. The method of claim 23, wherein forming the wall further comprising placing a cap on a top of the gate cut, wherein the cap and the liner enclose the volume of the gas.

25. The method of claim 23, wherein the liner includes a selected one or more of: silicon, nitrogen, carbon, oxygen, SiN, SiC, SiO, or SiCN.

\* \* \* \* \*